United States Patent
Guowei et al.

(10) Patent No.: US 9,252,213 B2
(45) Date of Patent: Feb. 2, 2016

(54) INTEGRATED CIRCUITS WITH A BURIED N LAYER AND METHODS FOR PRODUCING SUCH INTEGRATED CIRCUITS

(71) Applicant: GLOBALFOUNDRIES Singapore Pte. Ltd., Singapore (SG)

(72) Inventors: Zhang Guowei, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 60 days.

(21) Appl. No.: 14/134,731

(22) Filed: Dec. 19, 2013

(65) Prior Publication Data

US 2015/0179734 A1 Jun. 25, 2015

(51) Int. Cl.
*H01L 21/336* (2006.01)
*H01L 29/06* (2006.01)
*H01L 21/324* (2006.01)
*H01L 21/762* (2006.01)
*H01L 21/02* (2006.01)
*H01L 21/265* (2006.01)
*H01L 21/3205* (2006.01)

(52) U.S. Cl.
CPC ........ *H01L 29/0649* (2013.01); *H01L 21/0228* (2013.01); *H01L 21/02164* (2013.01); *H01L 21/265* (2013.01); *H01L 21/324* (2013.01); *H01L 21/32055* (2013.01); *H01L 21/76224* (2013.01); *H01L 21/76237* (2013.01)

(58) Field of Classification Search
CPC .................. H01L 21/76237; H01L 21/823493
USPC ......................... 438/420, 524, 561
See application file for complete search history.

(56) References Cited

U.S. PATENT DOCUMENTS 5,675,173 A * 10/1997 Kawai et al. .................. 257/508
7,723,800 B2 * 5/2010 Moens et al. ................. 257/374

* cited by examiner

*Primary Examiner* — Chandra Chaudhari
(74) *Attorney, Agent, or Firm* — Ingrassia Fisher & Lorenz, P.C.

(57) ABSTRACT

Integrated circuits with a buried N layer and methods for fabricating such integrated circuits are provided. The method includes forming a buried N layer overlying a substrate, and forming a monocrystalline layer overlying the buried N layer. After forming the monocrystalline layer, a well tap trench is formed, where the well tap trench penetrates the electronics area and the buried N layer and extends into the substrate. A well tap is formed in the well tap trench.

14 Claims, 3 Drawing Sheets

INTEGRATED CIRCUITS WITH A BURIED N LAYER AND METHODS FOR PRODUCING SUCH INTEGRATED CIRCUITS

TECHNICAL FIELD

The technical field generally relates to integrated circuits and methods for producing integrated circuits, and more particularly relates to integrated circuits with a buried N layer for charge isolation and methods for producing such integrated circuits.

BACKGROUND

Many integrated circuits include a buried N layer that serves to electrically isolate electronic components produced over the buried N layer. A buried N layer is doped with "N" conductivity-determining ions and overlies a substrate lightly doped with "P" conductivity-determining ions, and a monocrystalline layer overlies the buried N layer. A well tap extends through the monocrystalline layer and the buried N layer, and the substrate under the buried N layer is biased or electrically charged to prevent noise or charge migration induced by high voltage electronic components on the monocrystalline layer. The electric charge is induced into the substrate through the well tap. The buried N layer is often used with bipolar transistor devices, or integrated circuits using both bipolar and complementary metal oxide semiconductor (CMOS) transistors, but the buried N layer can be beneficial in other uses as well.

Existing methods for fabricating a buried N layer produce a "step" or raised surface of the substrate. The step height is normally in the range of about 500 to about 1,000 angstroms, and this step is transferred to the monocrystalline layer when it is formed overlying the substrate. The step is used to aid in mask alignment, but the step remains in the monocrystalline layer that overlies the buried N layer. Before manufacturing electronic components, the monocrystalline layer is leveled by chemical mechanical planarization to provide a smooth, flat surface. The uneven surface with "steps" complicates leveling by chemical mechanical planarization, and the leveling process becomes more difficult with smaller integrated circuits. The varying surface height also interferes with photoresist patterning because the depth of focus changes with the uneven surface height.

Accordingly, it is desirable to provide integrated circuits with buried N layers where the monocrystalline layer upper surface is smooth and flat. In addition, it is desirable to provide methods for producing such integrated circuits with fewer manufacturing steps to help control production costs. Furthermore, other desirable features and characteristics of the present embodiment will become apparent from the subsequent detailed description and the appended claims, taken in conjunction with the accompanying drawings and this background.

BRIEF SUMMARY

Integrated circuits with a buried N layer and methods for fabricating such integrated circuits are provided. In an exemplary embodiment, a method is provided for producing an integrated circuit. The method includes forming a buried N layer overlying a substrate, and forming a monocrystalline layer overlying the buried N layer. After forming the monocrystalline layer, a well tap trench is formed, where the well tap trench penetrates the electronics area and the buried N layer and extends into the substrate. A well tap is formed in the well tap trench.

In another exemplary embodiment, a method for fabricating an integrated circuit includes forming a buried N layer by blanket implanting ions into a substrate. A monocrystalline layer is epitaxially grown overlying the buried N layer. A well tap trench is formed through the monocrystalline layer and the buried N layer such that a well tap trench bottom is in the substrate. An insulating sheath is formed in the well tap trench, and the insulating sheath is removed from the well tap trench bottom. A P well tap implant is formed in the substrate underlying the well tap trench, and a conductive core is formed within the insulating sheath.

In a further exemplary embodiment, an integrated circuit includes a buried N layer overlying a substrate. A monocrystalline layer overlies the buried N layer, and a well tap penetrates the monocrystalline layer and the buried N layer such that a well tap trench bottom is positioned in the substrate. The well tap includes an insulating sheath around a conductive core, where the insulating sheath extends from an electronics area upper surface through the buried N layer and into the substrate.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the application and uses of the embodiment described. Furthermore, there is no intention to be bound by any theory presented in the preceding background or the following detailed description.

Integrated circuits with buried N layers and methods for producing integrated circuits with buried N layers are provided herein. A buried N layer is used to reduce noise and electrically isolate high voltage electronic components in the integrated circuits. The buried N layer is produced by a blanket ion implant of "N" conductivity-determining ions. The use of a blanket implant eliminates the need for a mask to isolate areas for well taps within the buried N layer. A monocrystalline layer is formed overlying the buried N layer by epitaxial growth. The buried N layer and monocrystalline layer are produced without a mask for the well tap. Accordingly, the electronics layer is grown with a substantially planar upper or exposed surface. The lack of a mask for the formation of the buried N layer and the monocrystalline layer also reduces the number of manufacturing steps compared to methods that use such a mask. Subsequently, a hard etch mask is formed over the monocrystalline layer, and a well tap trench is anisotropically etched through the hard etch mask, the monocrystalline layer, the buried N layer, and into the substrate underlying the buried N layer. An insulating sheath is formed within the well tap trench, and then removed from a well tap trench bottom with an anisotropic etch. The insulating sheath remains on the side walls of the well tap trench. Ions are implanted through the well tap trench and into the substrate underlying the well tap trench to form a P well tap implant, which aids in electrical conduction. The well tap trench is then filled with a conductive core, where the conductive core carries a charge to the substrate under the buried N layer to isolate electronic components on the monocrystalline layer.

Figure 1:
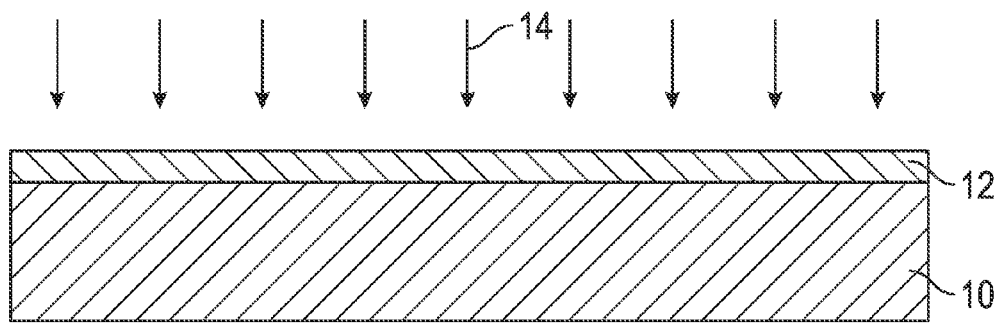
FIGS. 1-6 illustrate, in cross sectional views, a portion of an integrated circuit and methods for its fabrication in accordance with exemplary embodiments.

Referring to FIG. 1, a buried N layer 12 is formed overlying a substrate 10. As used herein, the term "overlying" means "over" such that an intervening layer may lie between the buried N layer 12 and the substrate 10, and "on" such the buried N layer 12 physically contacts the substrate 10. The term "substrate" 10, as used herein, will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer (as illustrated) or may be a thin layer of silicon on an insulating layer (commonly known as silicon-on-insulator or SOI) that, in turn, is supported by a carrier wafer. In an exemplary embodiment, the substrate 10 is lightly doped with "P" conductivity-determining ions, such as boron, aluminum, gallium, and/or indium.

In an exemplary embodiment, the buried N layer 12 is formed by blanket implanting "N" type conductivity-determining ions 14 into the upper surface of the substrate 10. Blanket implanting means implanting without the use of a mask, so the entire surface of the substrate is implanted. "N" type conductivity-determining ions 14 primarily include ions of phosphorous, arsenic, and/or antimony, but other materials could also be used. In some embodiments, "N" type conductivity-determining ions 14 with higher molecular weights are used, such as arsenic or antimony. Ion implantation involves ionizing a dopant and accelerating the dopant ions into the substrate 10 under the influence of an electrical field. In an exemplary embodiment, the conductivity-determining ions 14 are accelerated with an energy of about 10 to about 500 kilo electron volts, but different energies can also be used. The buried N layer 12 is then annealed to repair crystal damage from the ion implantation process, to electrically activate the dopants, and to redistribute the ions. The annealing process can use widely varying temperatures, such as temperatures ranging from about 1,000 degrees centigrade (° C.) to about 1,200° C. In alternate embodiments, the buried N layer 12 is formed using thermal diffusion processes. The substrate 10 underlying the buried N layer 12 may be doped with "P" conductivity-determining ions, as mentioned above, so there is a P/N interface at the intersection of the substrate 10 and the buried N layer 12. In an exemplary embodiment, the buried N layer 12 is about 1 micron to about 4 microns thick after all thermal cycles are complete.

Figure 2:
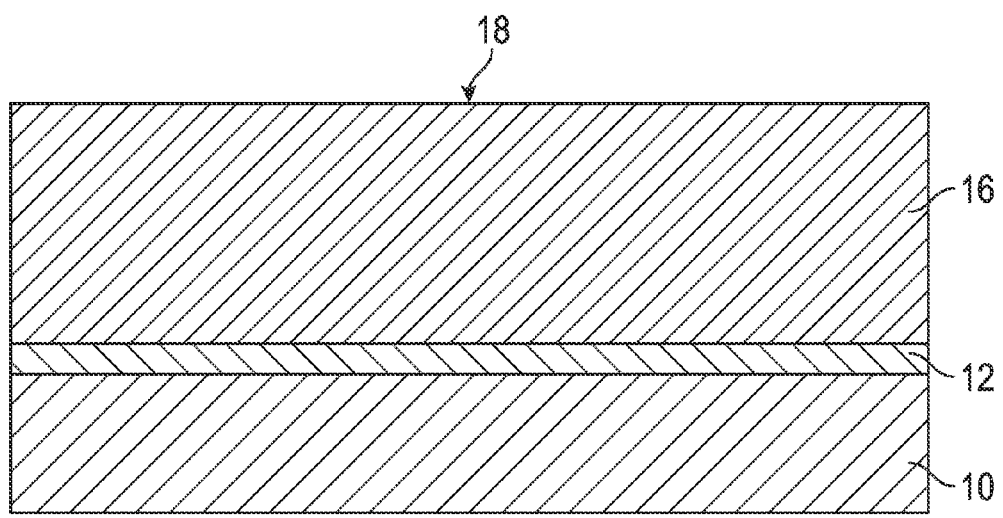

A monocrystalline layer 16 is formed overlying the buried N layer 12, as illustrated in FIG. 2. In an exemplary embodiment, the monocrystalline layer 16 is monocrystalline silicon formed by epitaxial growth, but the monocrystalline layer 16 can also be other semiconductor materials. The monocrystalline layer 16 includes low concentrations of "P" conductivity-determining ions in some embodiments, but it includes low concentrations of "N" conductivity-determining ions in other embodiments. Electronic components are produced on the monocrystalline layer 16, and the type of conductivity-determining ions is selected to match the type of electronic component to be produced. The ions can be incorporated into the monocrystalline layer 16 during the epitaxial growth process. In an exemplary embodiment, the monocrystalline layer 16 is grown by vapor phase epitaxy using silicon tetrachloride and hydrogen gas, but other types of epitaxy can also be used, such as molecular beam epitaxy. In some embodiments, the monocrystalline layer 16 is about 1 to about 50 microns thick, especially when used for high voltage electronic components. In other embodiments, the monocrystalline layer 16 is about 50 to about 300 nanometers, especially when used with devices for radio frequency applications. Other thicknesses are also possible, and a specific thickness is not required for any one type of device or application. Doping impurities of the desired type are added to the source gas during the epitaxial growth, so the monocrystalline layer 16 is formed with the desired dopant at the desired concentration. The upper surface of the buried N layer 12 is at least substantially flat because it was formed by a blanket ion implantation of the substrate 10, so it provides a substantially flat surface for the growth of the monocrystalline layer 16. As a result, a monocrystalline layer upper surface 18 is substantially flat and smooth.

Figure 3:
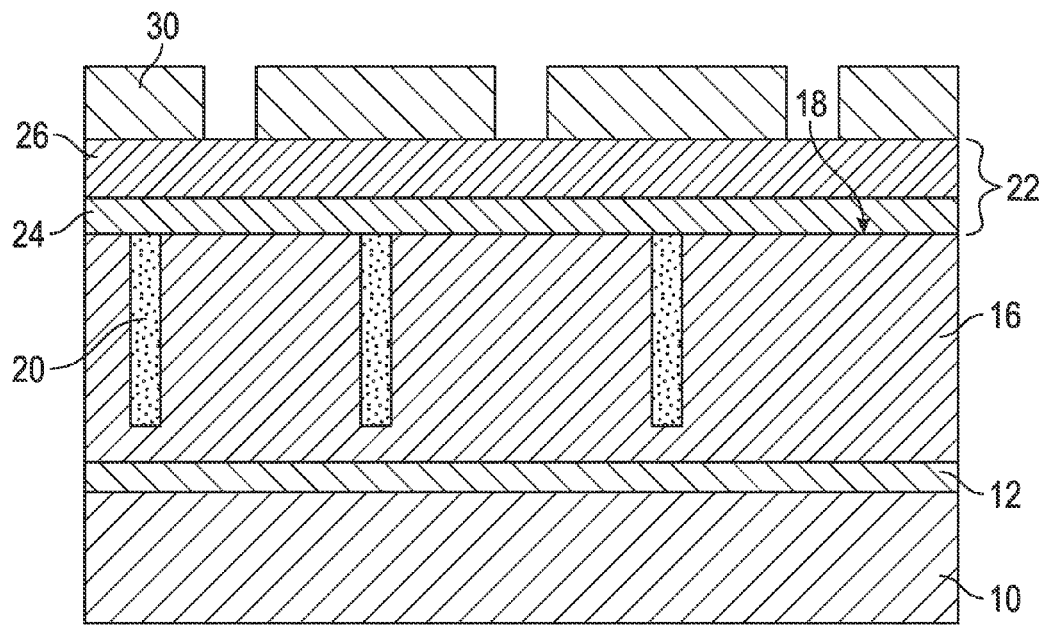

Reference is now made to FIG. 3. In an exemplary embodiment, a shallow trench isolation 20 is formed in the monocrystalline layer 16 using standard techniques well known to those skilled in the art. The shallow trench isolation 20 is formed from an insulating material, such as silicon dioxide, and extends from the monocrystalline layer upper surface 18 to within the monocrystalline layer 16. A hard etch mask 22 is formed overlying the monocrystalline layer 16 and the shallow trench isolation 20. In one embodiment, the hard etch mask 22 includes a hard etch mask first layer 24 and an overlying hard etch mask second layer 26. The hard etch mask first layer 24 can be, for example, silicon dioxide, which can be deposited, for example, by chemical vapor deposition using silane and oxygen. The hard etch mask second layer 26 can be, for example, silicon nitride, which can be deposited, for example, by low pressure chemical vapor deposition using ammonia and dichlorosilane. In alternate embodiments, the hard etch mask 22 includes only one layer, and a wide variety of materials can be used.

A well tap photoresist layer 30 is formed overlying the hard etch mask 22, and then patterned and developed to expose an area to etch for a well tap, as described below. In an exemplary embodiment, the well tap photoresist layer 30 is deposited by spin coating, and patterned by exposure to light or other electromagnetic radiation through a mask. The light causes a chemical change in the photoresist such that either the exposed portion or the non-exposed portion can be selectively removed. The desired locations are removed with an organic solvent.

Figure 4:
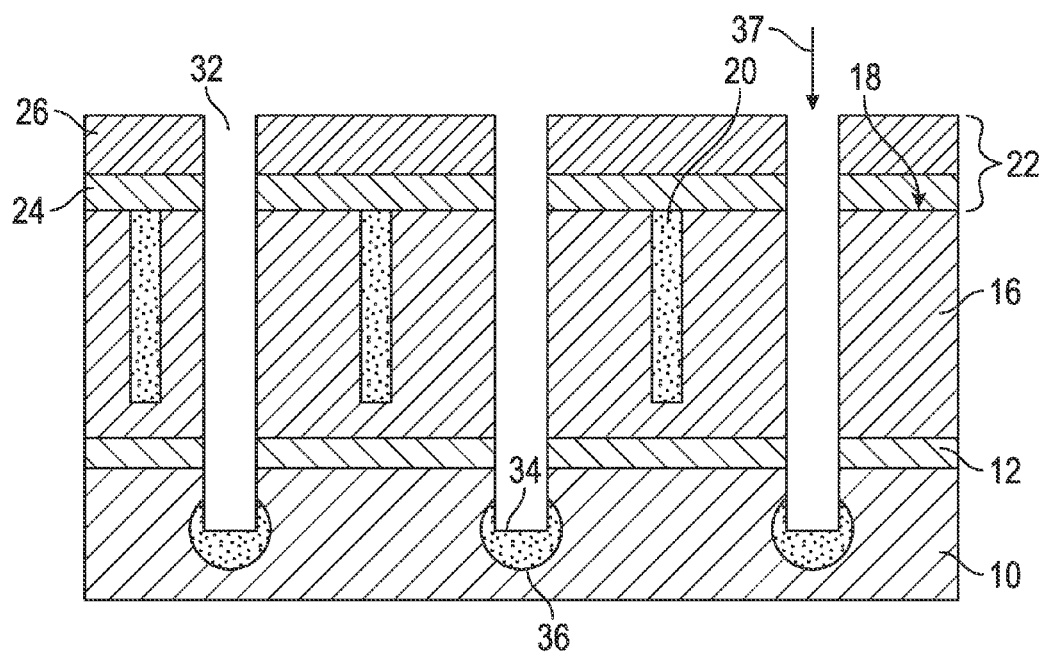

Referring to FIG. 4, a well tap trench 32 is formed through the hard etch mask 22, the monocrystalline layer 16, the buried N layer 12, and into the substrate 10. The well tap trench 32 terminates within the substrate 10 at a well tap trench bottom 34. The well tap trench 32 is formed by anisotropic etching, such as with reactive ion etching, and several different steps can be used to etch through the various materials. In an exemplary embodiment, the silicon nitride in the hard etch mask second layer 26 is etched with silicon hexafluoride, the silicon dioxide in the hard etch mask first layer 24 is etched with carbon tetrachloride, and the silicon of the monocrystalline layer 16, the buried N layer 12, and the substrate 10 are etched with carbon tetrafluoride. The well tap photoresist layer 30 can be removed with an oxygen-containing plasma at a variety of stages in the process, including after the hard etch mask second layer 26 is etched, after the hard etch mask first layer 24 is etched, or after the monocrystalline layer 16, buried N layer 12, and substrate 10 have been etched.

In an exemplary embodiment, a well tap implant 36 is formed in the substrate underlying the well tap trench 32 by ion implantation. "P" type dopant ions are implanted at zero degrees, or along an ion implantation direction 37 at least substantially perpendicular to monocrystalline layer upper surface 18, so the "P" type conductivity-determining ions travel through the well tap trench 32 and enter the substrate at the well tap trench bottom 34. The "P" type conductivity-determining ions implanted into the top surface of the hard etch mask 22 do not influence the integrated circuit because the hard etch mask 22 is removed at a later stage.

Figure 5:
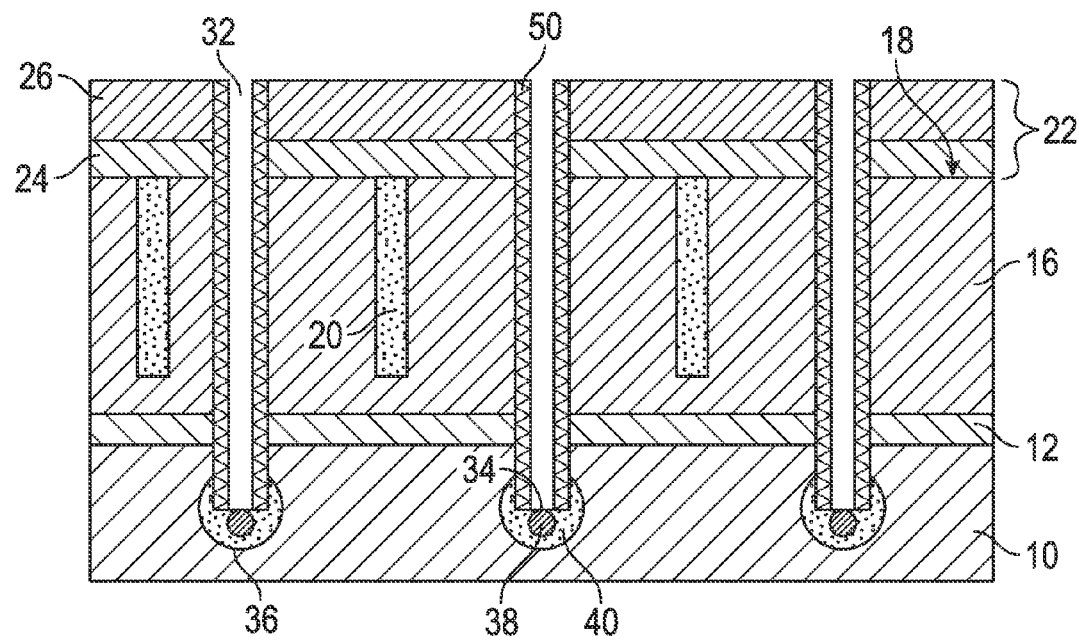

An insulating sheath 50 is formed within the well tap trench 32, as illustrated in FIG. 5. The insulating sheath 50 is formed from an insulating material, and is conformally deposited to produce a thin layer that extends down the entire length of the well tap trench 32. In an exemplary embodiment, the insulating sheath 50 is formed of silicon dioxide deposited by atomic layer deposition using pulses of 3 aminopropyl triethoxy silane (APTES), water, and ozone to a thickness of about 10 to about 800 nanometers, where a thicker insulating sheath 50 may be used for high voltages. The deposited silicon dioxide covers the well tap trench bottom 34 and the upper surface of the hard etch mask 22 as well as the side walls of the well tap trench 32. The deposited silicon dioxide of the insulating sheath 50 then is removed from the essentially horizontal surfaces of the well tap trench bottom 34 (and the hard etch mask 22) with an anisotropic dry plasma etch using carbon tetrafluoride in a hydrogen ambient. The insulating sheath 50 remains on the side walls of the well tap trench 32 because the anisotropic etch does not remove the vast majority of the material along the vertical side wall surfaces. Some silicon oxide may be removed from the side walls of the well tap trench 32 near the upper surface of the hard etch mask 22, but the hard etch mask 22 is removed at a later time so any imperfections within the hard etch mask 22 do not impair the remaining insulating sheath 50.

Additional "P" type conductivity-determining ions may optionally be implanted in the well tap implant 36 after the insulating sheath 50 has been deposited. In an exemplary embodiment, the additional "P" type conductivity-determining ions are implanted after the anisotropic dry plasma etch to remove the silicone dioxide from the well tap trench bottom 34, but in some embodiments, the "P" type conductivity-determining ions are implanted through the silicon oxide at the well tap trench bottom 34. If additional "P" type conductivity-determining ions are implanted, the well tap implant 36 has two different portions with different "P" type dopant concentrations. A well tap implant inner portion 38 has a "P" type dopant concentration of about $8 \times 10^{18}$ to about $1 \times 10^{20}$ atoms per cubic centimeter, and a well tap implant outer portion 40 has a "P" type dopant concentration of about $1 \times 10^{16}$ to about $8 \times 10^{18}$ atoms per cubic centimeter. The well tap implant 36 improves electrical conduction to strengthen the electrical connection between the well tap (described below) and the substrate 10. The well tap implant 36 is annealed to activate the implanted ions, as described above with reference to the annealing of the buried N layer.

Figure 6:
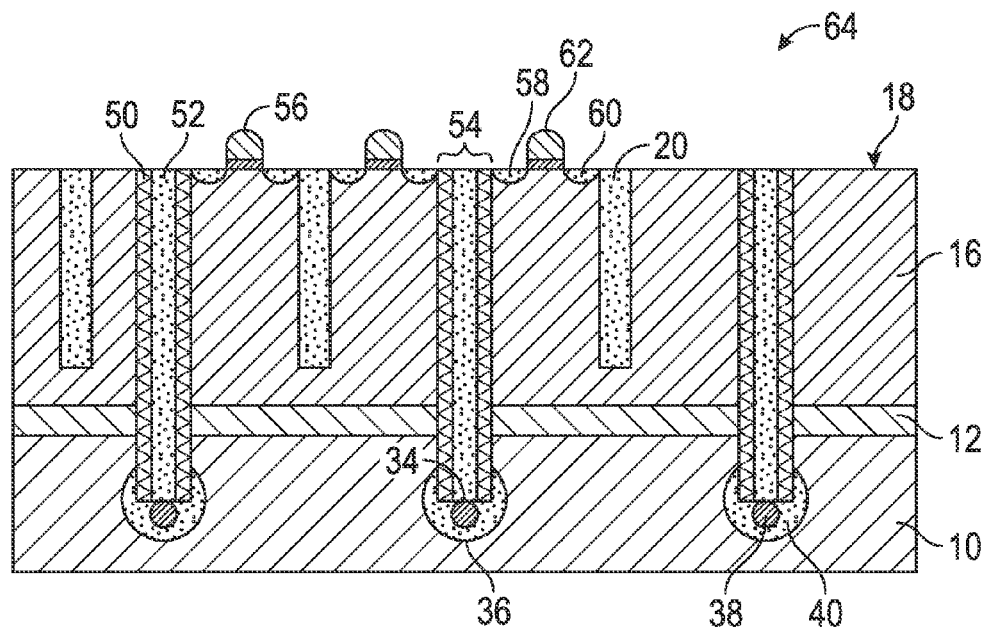

Referring to FIG. 6, a conductive core 52 is formed within the insulating sheath 50 to produce the well tap 54, where the well tap 54 includes the insulating sheath 50 and the conductive core 52. The conductive core 52 is formed after etching the insulating sheath 50 from the well tap trench bottom 34, so the conductive core 52 makes an electrical connection with the substrate 10. The conductive core 52 contains a conductive material, and in an exemplary embodiment is doped polysilicon deposited by low pressure chemical vapor deposition using silane and impurity dopants. The hard etch mask 22 and any overburden from the conductive material of the conductive core 52 are removed by chemical mechanical planarization. The monocrystalline layer upper surface 18 and the hard etch mask 22 are essentially flat, because the monocrystalline layer 16 was epitaxially grown from a flat surface, and this aids in the uniform removal of the hard etch mask 22.

An electronic component 56 is formed overlying the monocrystalline layer 16, where the electronic component 56 is illustrated as a field effect transistor with a source 58, a drain 60, and a gate 62. Many other types of electronic components 56 may be formed and interconnected to produce an integrated circuit 64, including high voltage transistors, finned field effect transistors (FinFETS), amplifiers, resistors, capacitors, bipolar transistors, etc. The method of producing the electronic component 56 is not critical to this description, and a wide variety of methods known to those skilled in the art can be used. In some embodiments, a portion of the monocrystalline layer 16 is utilized in the electronic component 56, such as the source 58 and drain 60 formed within the monocrystalline layer 16, but the electronic component 56 is still said to overlie the monocrystalline layer 16.

The conductive core 52 is electrically connected to the well tap implant 36, so electrical current can flow through the well tap 54 to the substrate 10 underlying the buried N layer 12. The insulating sheath 50 prevents charge migration from the conductive core 52 to the monocrystalline layer 16, so a bias introduced to the upper surface of the well tap 54 is conducted to the substrate 10 underlying the buried N layer 12. In an exemplary embodiment, the electronic component 56 includes a high voltage electronic component 56, and the buried N layer 12 reduces noise and charge migration. Different well taps 54 at different locations allows for varying charges of the substrate 10, so the charge can be matched with the electronic component 56 above.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   forming a buried N layer overlying a substrate;
   forming a monocrystalline layer overlying the buried N layer;
   forming a well tap trench after forming the monocrystalline layer, wherein the well tap trench penetrates the monocrystalline layer and the buried N layer and extends into the substrate; and
   forming a well tap in the well tap trench, wherein forming the well tap comprises forming an insulating sheath within the well tap trench;
   etching the insulating sheath from a well tap trench bottom after forming the insulating sheath; and
   forming a well tap implant in the substrate underlying the well tap, wherein forming the well tap implant further comprises:

implanting "P" type dopant ions into the substrate through the well tap trench prior to forming the insulating sheath; and
    implanting "P" type dopant ions into the substrate through the well tap trench after forming the insulating sheath.

2. The method of claim 1 wherein forming the monocrystalline layer further comprises:
    growing the monocrystalline layer by epitaxial growth, wherein the monocrystalline layer is grown with "N" conductivity-determining ions.

3. The method of claim 1 wherein forming the monocrystalline layer further comprises:
    growing the monocrystalline layer by epitaxial growth, wherein the monocrystalline layer is grown with "P" conductivity-determining ions.

4. The method of claim 1 wherein forming the buried N layer further comprises:
    implanting "N" type ions into the substrate; and
    annealing the substrate to produce the buried N layer.

5. The method of claim 1 wherein forming the well tap in the well tap trench further comprises:
    forming a conductive core within the insulating sheath.

6. The method of claim 1 wherein forming the well tap in the well tap trench further comprises forming the insulating sheath such that the insulating sheath extends through the buried N layer.

7. The method of claim 1 wherein
    forming the insulating sheath within the well tap trench comprises forming the insulating sheath by atomic layer deposition.

8. The method of claim 1 wherein forming the well tap further comprises:
    forming a conductive core within the insulating sheath after etching the insulating sheath from the well tap trench bottom.

9. The method of claim 8 wherein forming the conductive core further comprises depositing polysilicon within the insulating sheath, wherein the polysilicon is doped with a "P" type dopant.

10. A method of producing an integrated circuit comprising:
    forming a buried N layer by blanket implanting ions into a substrate;
    epitaxially growing a monocrystalline layer overlying the buried N layer;
    forming a well tap trench through the monocrystalline layer and the buried N layer such that a well tap trench bottom is in the substrate;
    implanting "P" dopant ions into the substrate through the well tap trench;
    forming an insulating sheath in the well tap trench after implanting "P" dopant ions into the substrate through the well tap trench;
    removing the insulating sheath from the well tap trench bottom;
    implanting "P" type dopant ions into the substrate through the well tap trench after forming the insulating sheath; and
    forming a conductive core within the insulating sheath.

11. The method of claim 10 wherein forming the monocrystalline layer further comprises:
    growing the monocrystalline layer with "N" conductivity-determining ions by epitaxial growth.

12. The method of claim 10 wherein forming the monocrystalline layer further comprises:
    growing the monocrystalline layer with "P" conductivity-determining ions by epitaxial growth.

13. The method of claim 10 wherein forming the insulating sheath further comprises:
    depositing silicon dioxide within the well tap trench by atomic layer deposition.

14. The method of claim 10 wherein forming the conductive core further comprises depositing polysilicon within the insulating sheath, wherein the polysilicon is doped with a "P" type dopant.

* * * * *